US009319021B2

(12) United States Patent
Ehyaie et al.

(10) Patent No.: US 9,319,021 B2
(45) Date of Patent: Apr. 19, 2016

(54) DIGITALLY CONTROLLED PHASE SHIFTER

(71) Applicant: QUALCOMM Incorporated, San Diego, CA (US)

(72) Inventors: Danial Ehyaie, San Francisco, CA (US); Muhammad Adnan, Ithaca, NY (US)

(73) Assignee: QUALCOMM Incorporated, San Diego, CA (US)

( * ) Notice: Subject to any disclaimer, the term of this patent is extended or adjusted under 35 U.S.C. 154(b) by 495 days.

(21) Appl. No.: 13/691,308

(22) Filed: Nov. 30, 2012

(65) Prior Publication Data

US 2014/0152399 A1 Jun. 5, 2014

(51) Int. Cl.
*H03H 7/20* (2006.01)
*H03H 7/18* (2006.01)

(52) U.S. Cl.
CPC *H03H 7/20* (2013.01); *H03H 7/185* (2013.01)

(58) Field of Classification Search
CPC ........... H03H 7/20; H03H 7/18; H03H 7/186; H03H 7/185; H01P 1/18
USPC .......................................... 333/139, 262, 156
See application file for complete search history.

(56) References Cited

U.S. PATENT DOCUMENTS 3,546,636 A 12/1970 Di Piazza
4,733,203 A * 3/1988 Ayasli ........................... 333/139
5,521,560 A * 5/1996 Burns ..................... H01P 1/227 333/262
7,239,218 B2 7/2007 Nakamura
7,400,211 B2 7/2008 Lee et al.
7,495,529 B2 2/2009 Miyaguchi et al.
2003/0137284 A1 * 7/2003 DiPiazza ....................... 323/212
2011/0063169 A1 3/2011 Chen et al.

FOREIGN PATENT DOCUMENTS

EP 0687062 A1 12/1995
JP H02151113 A 6/1990

OTHER PUBLICATIONS

Chiang Y.C., et al., "A 60GHz Digitally Controlled 4-bit Phase Shifter with 6-ps Groups Delay Deviation", IEEE MTT-S International Microwave Symposium Digest (MTT), Aug. 6, 2012, 3 pages.
Yu Y., et. al, "A 60GHz Digitally Controlled Phase Shifter in CMOS", 34th European Solid-State Circuits Conference, 2008, IEEE, ESSCIRC 2008, pp. 250-253.
International Search Report and Written Opinion—PCT/US2013/072310—ISA/EPO—Mar. 12, 2014.

* cited by examiner

*Primary Examiner* — Benny Lee
*Assistant Examiner* — Albens Dieujuste
(74) *Attorney, Agent, or Firm* — Linda G. Gunderson

(57) ABSTRACT

A digitally controlled phase shifter is disclosed. In an exemplary embodiment, an apparatus includes a first component connected between a first terminal and a node, a second component connected between a second terminal and the node, an impedance selectively connected between the first and second terminals by a first switch, and a second switch to connected between the node and a ground. The apparatus is configured to provide a first amount of phase shift when the first and second switches are in an open position, and a second amount of phase shift when the first and second switches are in a closed position.

14 Claims, 5 Drawing Sheets

300
302
310
SW1
312
304
306
$\theta_1/2$
$\theta_1/2$
308
316
314
SW2

DIGITALLY CONTROLLED PHASE SHIFTER

BACKGROUND

1. Field

The present application relates generally to the operation and design of analog front ends, and more particularly, to the operation and design of phase shifters for use in an analog front end.

2. Background

Beamforming transceivers having multiple antennas are typically utilized to transmit and receive signals over wireless links operating at millimeter wavelengths, for instance to transmit and receive signals at 60 GHz. Almost all beamforming applications are configured to have beamforming performed on RF signals, which requires the use of phase shifters that shift the phase of the RF signals that are transmitted or received over multiple antennas to form a desired beam pattern. Conventional phase shifters can be passive or active. Passive phase shifters can be shared between transmit (Tx) and receive (Rx) functions and have almost no power consumption, good linearity, and good noise performance. Unfortunately, the biggest challenges for conventional passive phase shifters are large signal loss and large group delay.

Accordingly, it would be desirable to have a simple and low cost passive phase shifter having low loss and small group delay.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
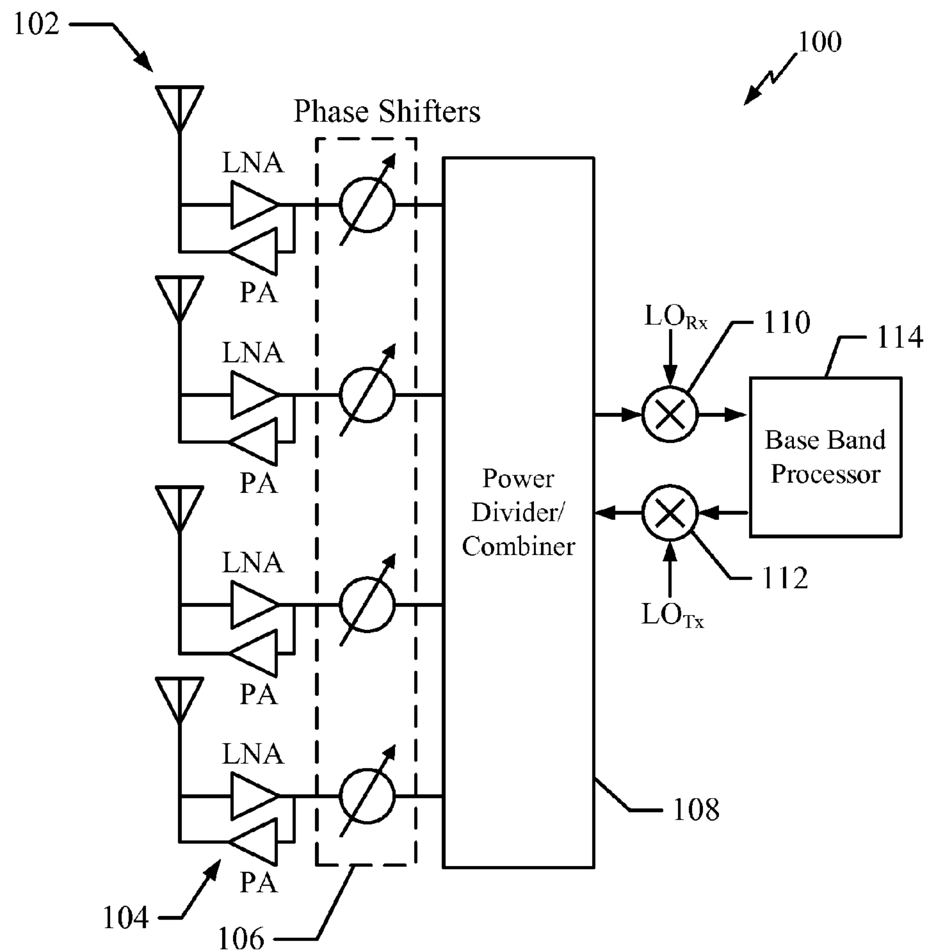
FIG. 1 shows an exemplary embodiment of a beamforming receiver.

FIG. 1 shows an exemplary embodiment of a beamforming receiver 100. The receiver 100 comprises a plurality of antennas 102 that provide received RF signals to corresponding low noise amplifiers (LNA), shown generally at 104. The antennas 102 also transmit signals received from corresponding power amplifiers (PA), also shown generally at 104. Phase shifters 106 are configured to selectively adjust the phase of the received RF signals or of the RF signals to be transmitted.

During reception, phase shifted RF signals output from the phase shifters 106 are input to a power combiner 108 that operates to combine the phase shifted RF signals into a single RF signal that is input to an RF downconverter 110. During transmission, the power combiner/divider 108 receives RF signals from an upconverter 112 and outputs power divided RF signals to the phase shifters 106, which shift the phase of these divided RF signals to form selected beam patterns.

The downconverter 110 provides a baseband signal to a baseband processor 114 and the upconverter 112 receives baseband signals to be transmitted from the baseband processor 114. In various exemplary embodiments, the phase shifters 106 are novel bidirectional digitally controlled passive phase shifters that provide low loss and small group delay when compared to conventional passive phase shifters. In various exemplary embodiments discussed below, the phase shifters 106 are novel passive phase shifters having low loss and small group delay.

Figure 2:
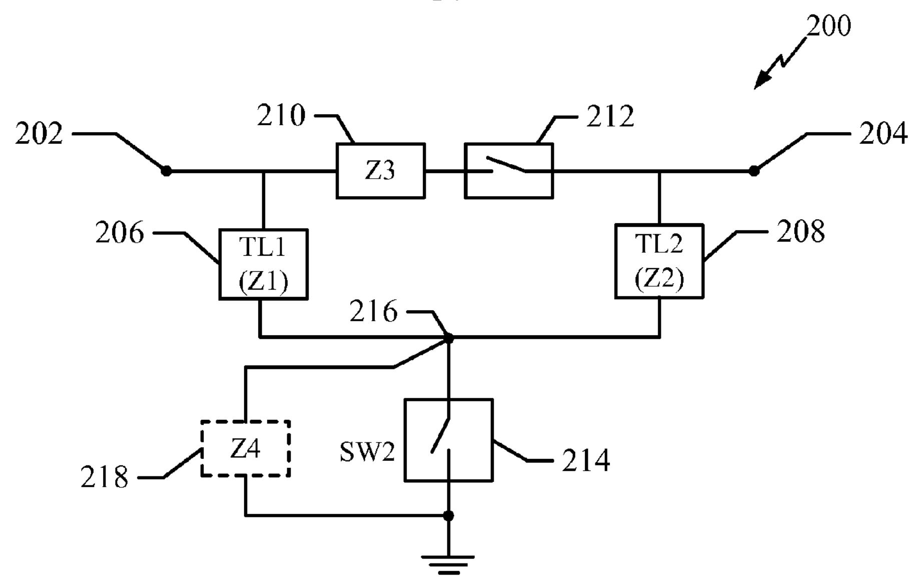
FIG. 2 shows an exemplary embodiment of a phase shifter configured for use in the beamforming receiver shown in FIG. 1

FIG. 2 shows an exemplary embodiment of a phase shifter 200. For example, the phase shifter 200 is suitable for use as any of the phase shifters 106 shown in FIG. 1. The phase shifter 200 is a bidirectional passive phase shifter and operates to phase shift both Rx and Tx signals. For example, the phase shifter 200 is configured to receive an RF signal at a first terminal 202, apply a phase shift to that RF signal, and output a phase shifted RF signal at a second terminal 204. The phase shifter is also configured to operate when the signal flow is reversed so that an RF signal can be received at the second terminal 204, phase shifted, and output at the first terminal 202.

The phase shifter 200 comprises a first transmission line (TL1) 206 connected between the first terminal 202 and a node 216. It will be assumed that the first transmission line 206 has an effective impedance of (Z1). The first terminal is also connected to third impedance 210. The third impedance 210 is further coupled to a first switch (SW1) 212. The SW1 212 is coupled to the second terminal 204. A second transmission line (TL2) 208 is coupled between the second terminal 204 and the node 216. It will be assumed that the second transmission line 208 has an effective impedance of (Z2). A second switch (SW2) 214 is coupled between the node 216 and ground. As described in more detail below, by opening and closing the switches (SW1, SW2), the phase shifter 200 provides selectable amounts of phase shift with low loss and small group delay. In an exemplary alternative embodiment, the phase shifter 200 comprises a fourth impedance 218 connected between the node 216 and the ground.

During operation, the phase shifter 200 provides a first amount of phase shift when the switches 212, 214 are open and a second amount of phase shift when the switches 212, 214 are closed. The difference between the first amount of phase shift and the second amount of phase shift can be selectably set through component selection. Also, the group delay when the switches 212, 214 are open is substantially the same as the group delay when the switches 212, 214 are closed.

Figure 3:
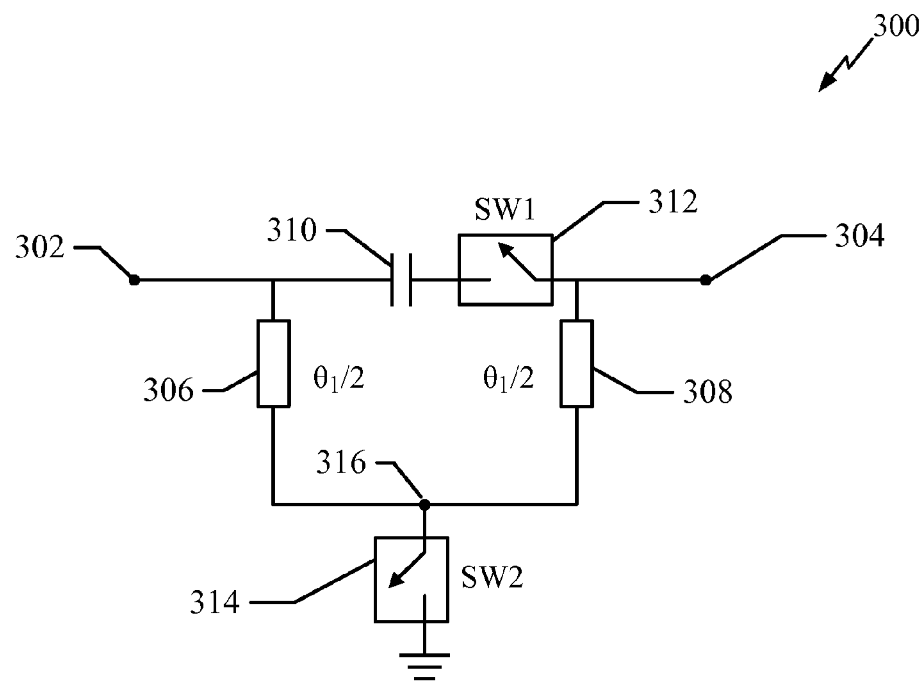
FIG. 3 shows an exemplary embodiment of a phase shifter shown in FIG. 2 configured for use in the beamforming receiver.

FIG. 3 shows an exemplary embodiment of a phase shifter 300. For example, the phase shifter 300 is an exemplary implementation of the phase shifter 200 and suitable for use as any of the phase shifters 106 shown in FIG. 1. The phase shifter 300 is a bidirectional passive phase shifter and is operable to phase shift signals flowing in either direction. For the purpose of this description, the phase shifter 300 will be describe in the context of receiving an RF signal at a first terminal 302, applying a phase shift to that RF signal, and outputting a phase shifted RF signal at a second terminal 304. However, the phase shifter 300 can also provide the identical phase shift to signals flowing in the opposite direction.

The phase shifter 300 comprises a first component comprising a first transmission line 306 connected between the first terminal 302 and a node 316. The first terminal 302 is also connected to a capacitor 310. The capacitor 310 is further connected to a first switch (SW1) 312. The switch (SW1) 312 is connected to the second terminal 304. A second component comprising a second transmission line 308 is coupled between the second terminal 304 and the node 316. A second switch (SW2) 314 is connected between the node 316 and a ground. Each of the first 306 and second 308 transmission lines are configured to provide a selected amount of phase shift designated as $(\theta_1/2)$. As described in more detail below, by opening and closing the switches (SW1, SW2), the phase shifter 300 provides selectable amounts of phase shift with low loss and a small or zero difference in group delay.

Figure 4:
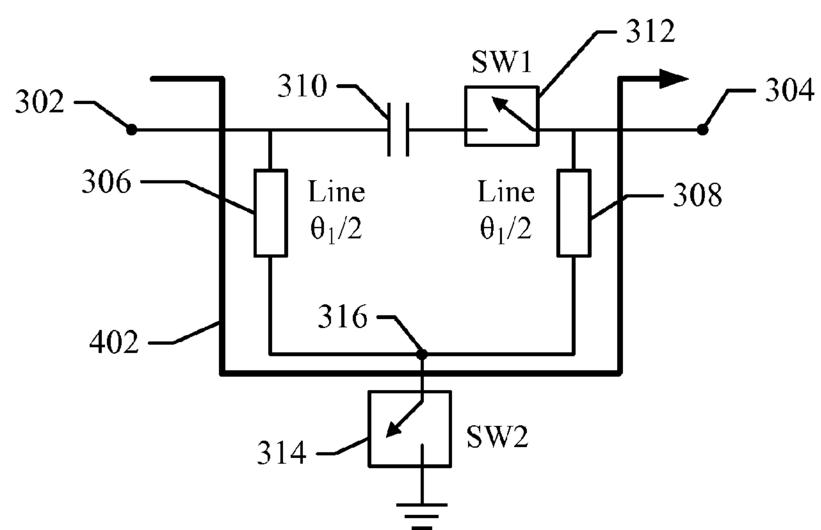
FIGS. 4-6 show exemplary illustrations of RF signal flow through the phase shifter shown in FIG. 3.

FIG. 4 shows an exemplary embodiment of the phase shifter 300 when both switches (SW1, SW2) are open. As illustrated by signal flow path 402, the RF signal at the first terminal 302 flows through the first transmission line 306 since SW1 is open. The switch SW2 is also open, which causes the RF signal to flow through the second transmission line 308 and out the second terminal 304. In this configuration, the phase shifter 300 applies a total phase shift $(\phi_1)$ to the RF signal flowing through the phase shifter 300 that is the sum of the phase shifts provided by the transmission lines 306 and 308. Thus, the total phase shift $(\phi_1)$ and the group delay $(G_{D1})$ can be expressed as follows.

$$\phi_1 = -\theta_1 \tag{1}$$

$$G_{D1} = (-\theta_1/\omega) \tag{2}$$

where $\omega$ is the operation frequency of interest.

Figure 5:
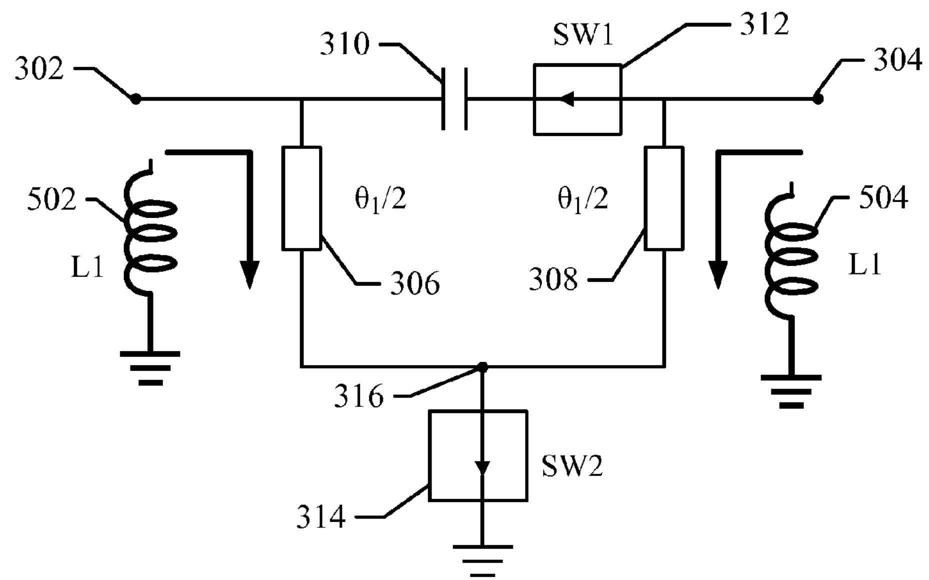

FIG. 5 shows an exemplary embodiment of the phase shifter 300 when both switches (SW1, SW2) are closed. When the switch SW2 314 is closed, the first 306 and second 308 transmission lines are connected to ground. In this configuration, the first 306 and second 308 transmission lines effectively act as first 502 and second 504 inductances (L1) coupled to ground through closed switch SW2. With switch (SW1) 312 closed, the capacitor 310 is enabled into the circuit. The resulting phase shift will be determined from this configuration as described below.

Figure 6:
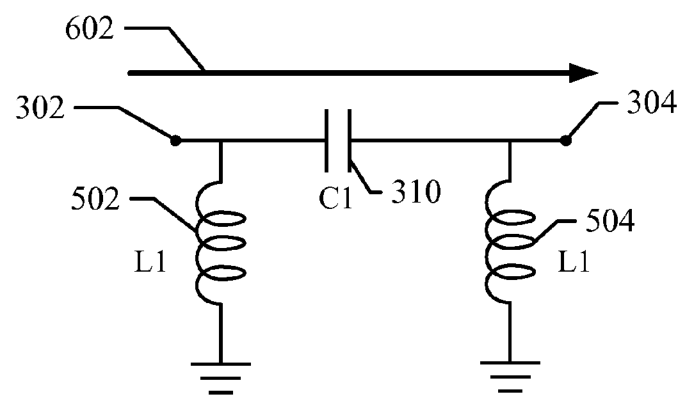

FIG. 6 shows an exemplary embodiment of the phase shifter 300 when both switches (SW1, SW2) are closed. As illustrated by signal path 602, the RF signal at the first terminal 302 flows through the combination of inductors 502, 504 and capacitor 310. In this configuration, the phase shifter 300 provides a total phase shift of $(\phi_2)$ to the RF signal. For example, the following equation can be used to determine the amount of total phase shift $(\phi_2)$ provided by the phase shifter 300 when the switches SW1 and SW2 are closed.

$$\phi_2 = -2*\arctan(R/(L1*\omega)) \tag{3}$$

where R is the characteristic impedance of the phase shifter 300 and L1 can be determined from the following equation;

$$0 = (L1*\omega)^2 - (2*L1*C1*\omega) + 1 \tag{4}$$

and the associated group delay $G_{D2}$ can be determined from the following expression.

$$G_{D2} = -2 \times \frac{\frac{-R}{L_1} \times \frac{1}{\omega^2}}{1 + \arctan^2\left(\frac{R}{L_1 \times \omega}\right)} \tag{5}$$

In various exemplary embodiments, the difference between the phase shifts $(\phi_1 - \phi_2)$ can be set to any desired value by selecting the appropriate components. For example, the difference between the phase shifts $(\phi_1 - \phi_2)$ can be set to 180, 90, 45, or any other amount. Thus, by controlling the switches 312, 314 it is possible to apply different amounts of phase shift to a selected signal. In the exemplary embodiment described above, the difference between the phase shifts $(\phi_1 - \phi_2)$ can expressed as;

$$\phi_1 - \phi_2 = -\theta_1 + 2*\arctan(R/(L1*\omega)) \tag{6}$$

In various exemplary embodiments, the difference in the group delays is small or zero so that $(G_{D1} = G_{D2})$, which represents an additional advantage over conventional phase shifters. For example, the difference between the group delays of the two paths (402, 602) at the design frequency can be minimized so that the overall difference in the group delay can be effectively zero as indicated by the following expression.

$$-\frac{\theta_1}{\omega} = -2 \times \frac{\frac{-R}{L_1} \times \frac{1}{\omega^2}}{1 + \arctan^2\left(\frac{R}{L_1 \times \omega}\right)} \tag{7}$$

Figure 7:
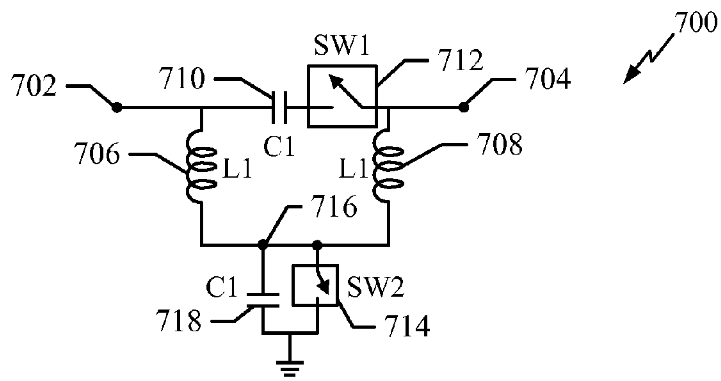
FIG. 7 shows an alternative exemplary embodiment of a phase shifter configured for use in the beamforming receiver shown in FIG. 1

FIG. 7 shows an alternative exemplary embodiment of a phase shifter 700. For example, the phase shifter 700 is suitable for use as any of the phase shifters 106 shown in FIG. 1. The phase shifter 700 is a bidirectional passive phase shifter and operates to phase shift signals flowing in either direction. For the purpose of this description, the phase shifter 700 will be describe in the context of receiving an RF signal at a first terminal 702, applying a phase shift to that RF signal, and outputting a phase shifted RF signal at a second terminal 704.

The phase shifter 700 comprises a first inductor 706 having an inductance value of (L1) and connected between the first terminal 702 and a node 716. The first terminal 702 is also connected to a capacitor 710 having a capacitance value of (C1). The capacitor 710 is further connected to a first switch SW1 712. The switch SW1 712 is connected to the second terminal 704. A second inductor 708 having an inductance value of (L1) is coupled between the second terminal 704 and the node 716. A second switch SW2 714 is connected between the node 716 and a ground. A second capacitor 718 having a capacitance value of (C1) is connected between the node 716 and the ground. In an exemplary embodiment, the capacitor 718 represents the fourth impedance 218 shown in FIG. 2. As described in more detail below, by opening and closing the switches (SW1, SW2), the phase shifter 700 provides selectable amounts of phase shift with low loss and small or zero difference in group delay. For example, in the ideal case, the group delay automatically becomes zero for the phase shifters shown in FIG. 7 and FIG. 9.

Figure 8:
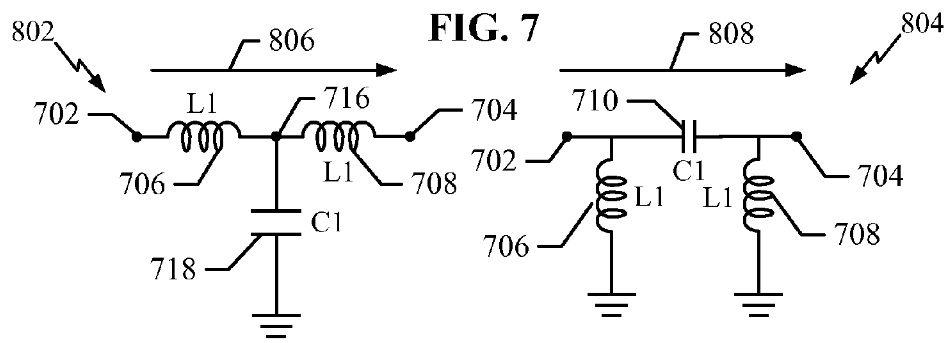
FIG. 8 shows exemplary illustrations of RF signal flow through the phase shifter shown in FIG. 7.

FIG. 8 shows exemplary illustrations of RF signal flow through the phase shifter 700 when the switches (SW1, SW2) are in open and closed positions. For example, the circuit 802 results when the switches are in the open position and the circuit 804 results when the switches are in the closed position.

Referring now to the circuit 802, when the switches SW1 and SW2 are in the open position thereby creating open circuits, the first 706 and second 708 inductors are connected in series to the first 702 and second 704 terminals, respectively. The node 716 is coupled to ground through the capacitor 718. In this configuration, a first amount of phase shift ($\phi_1$) is applied to signals that travel between the first terminal 702 and the second terminal 704. For example, in an exemplary implementation, the signal flow 806 represents a signal that travels from the first terminal 702 to the second terminal 704 and to which the first amount of phase shift will be applied.

For example, the following equation can be used to determined the first amount of phase shift ($\phi_1$) provided by the phase shifter 700 when the first and second switches are open.

$$\phi_1 = 2*\arctan(R/(L1*\omega)) \quad (8)$$

where ω is frequency and R is the characteristic impedance of the phase shifter 700.

Referring now to the circuit 804, when the switches SW1 and SW2 are in the closed position thereby creating circuit connections, the first 706 and second 708 inductors connect the first 702 and second 704 terminals to ground, and the capacitor 710 is connected between the first 702 and second 704 terminals. In this configuration, a second amount of phase shift ($\phi_2$) is applied to signals that travel between the first terminal 702 and the second terminal 704. For example, in an exemplary implementation, the signal flow 808 represents a signal that travels from the first terminal 702 to the second terminal 704 and to which the second amount of phase shift will be applied.

For example, the following equation can be used to determined the second amount of phase shift ($\phi_2$) provided by the phase shifter 700.

$$\phi_1 = -2*\arctan(R/(L1*\omega)) \quad (9)$$

where ω is frequency and R is the characteristic impedance of the phase shifter 700. Thus, by controlling the switches 712, 714 it is possible to apply different amounts of phase shift to a selected signal. In the exemplary embodiment described above, the difference between the phase shifts ($\phi_1-\phi_2$) can be selectably set through component selection. Furthermore, the associated difference in group delay automatically becomes very small or substantially zero.

Figure 9:
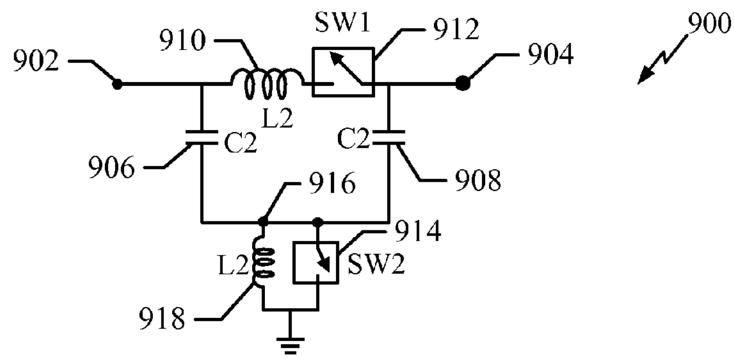
FIG. 9 shows an alternative exemplary embodiment of a phase shifter configured for use in the beamforming receiver shown in FIG. 1

FIG. 9 shows an alternative exemplary embodiment of a phase shifter 900. For example, the phase shifter 900 is suitable for use as any of the phase shifters 106 shown in FIG. 1. The phase shifter 900 is a bidirectional passive phase shifter and operates to phase shift of signals flowing in either direction. For the purpose of this description, the phase shifter 900 will be describe in the context of receiving an RF signal at a first terminal 902, applying a phase shift to that RF signal, and outputting a phase shifted RF signal at a second terminal 904.

The phase shifter 900 comprises a first capacitor 906 having a capacitance value of (C2) connected between the first terminal 902 and a node 916. The first terminal 902 is also connected to a first inductor 910 having an inductance value of (L2). The inductor 910 is further connected to a first switch SW1 912. The switch SW1 912 is connected to the second terminal 904. A second capacitor 908 having a capacitance value of (C2) is coupled between the second terminal 904 and the node 916. A second switch SW2 914 is connected between the node 916 and a ground. A second inductor 918 having an inductance value of (L2) is connected between the node 916 and the ground. In an exemplary embodiment, the inductor 918 represents the fourth impedance 218 shown in FIG. 2. As described in more detail below, by opening and closing the switches (SW1, SW2), the phase shifter 900 provides selectable amounts of phase shift with low loss and a small or zero difference in group delay.

Figure 10:
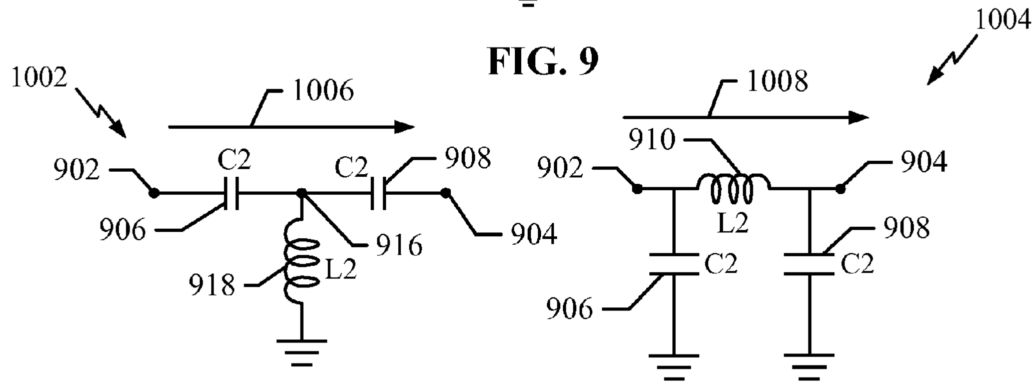
FIG. 10 shows exemplary illustrations of RF signal flow through the phase shifter shown in FIG. 9.

FIG. 10 shows exemplary illustrations of RF signal flow through the phase shifter 900 when the switches (SW1, SW2) are in open and closed positions. For example, the circuit 1002 results when the switches are in the open position and the circuit 1004 results when the switches are in the closed position.

Referring now to the circuit 1002, when the switches SW1 and SW2 are in the open position thereby creating open circuits, the first 906 and second 908 capacitors are connected in series to the first 902 and second 904 terminals, respectively. The node 916 is coupled to ground through the inductor 918. In this configuration, a first amount of phase shift ($\phi_1$) is applied to signals that travel between the first terminal 902 and the second terminal 904. For example, in an exemplary implementation, the signal flow 1006 represents a signal that travels from the first terminal 902 to the second terminal 904 and to which the first amount of phase shift ($\phi_1$) will be applied.

For example, the following equation can be used to determine the first amount of phase shift ($\phi_1$) provided by the phase shifter 900 with the first and second switches open.

$$\phi_1 = -2*\arctan(R*C2*\omega) \quad (10)$$

where ω is frequency and R is the characteristic impedance of the phase shifter 700.

Referring now to the circuit 1004, when the switches SW1 and SW2 are in the closed position thereby creating circuit connections, the first 906 and second 908 capacitors couple the first 902 and second 904 terminals to ground, and the inductor 910 is connected between the first 902 and second 904 terminals. In this configuration, a second amount of phase shift ($\phi_2$) is applied to signals that travel between the first terminal 902 and the second terminal 904. For example, in an exemplary implementation, the signal flow 1008 represents a signal that travels from the first terminal 902 to the second terminal 904 and to which the second amount of phase shift ($\phi_2$) will be applied.

For example, the following equation can be used to determined the second amount of phase shift ($\phi_2$) provided by the phase shifter 700.

$$\phi_2 = 2*\arctan(R*C2*\omega) \quad (11)$$

where ω is frequency and R is the characteristic impedance of the phase shifter 700. Thus, by controlling the switches 912, 914 it is possible to apply different amounts of phase shift to a selected signal. In the exemplary embodiment described above, the difference between the phase shifts ($\phi_1-\phi_2$) can be selectably set through component selection. Furthermore, the associated difference in group delay automatically becomes very small or substantially zero.

Figure 11:
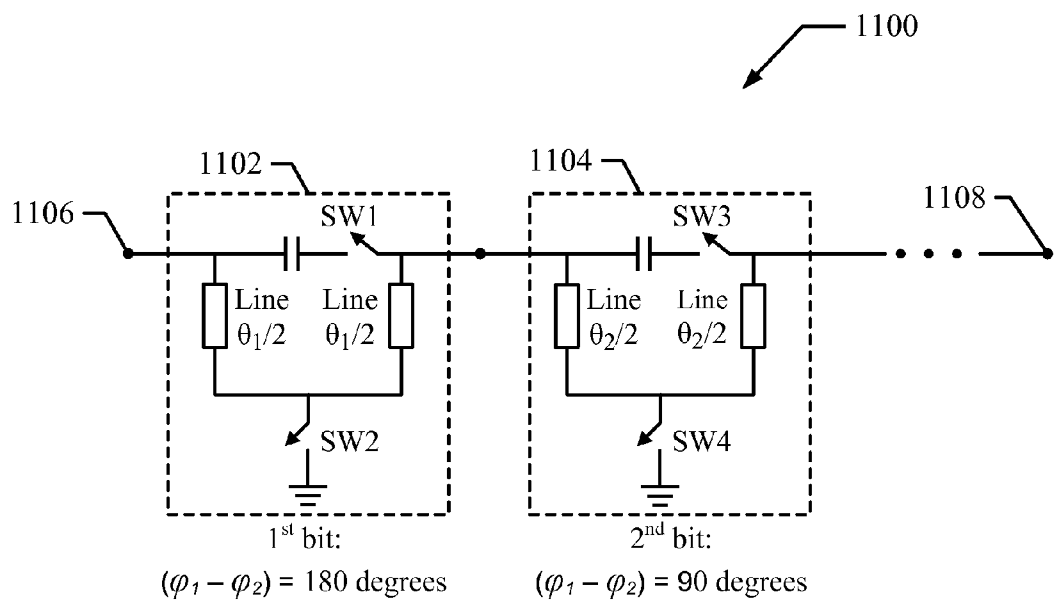
FIG. 11 shows an exemplary embodiment of a multi-bit phase shifter constructed from multiple implementations of the phase shifter shown in FIG. 2.

FIG. 11 shows an exemplary embodiment of a multi-bit phase shifter 1100 constructed from multiple implementations of the phase shifter 200 shown in FIG. 2. For example, the phase shifter 1100 is suitable for use as any of the phase shifters 106 shown in FIG. 1 and comprises a first bit 1102, a second bit 1104, and any number of additional bits. During operation, an RF signal is received at a first terminal 1106 and a phase shifted version of the RF signal is generated at a second terminal 1108.

The first bit 1102 of the phase shifter 1100 is configured as the phase shifter 300 shown in FIG. 3 and comprises transmission lines and components that are configured to generate a difference in phase shift ($\phi_1-\phi_2$) that is equal to 180 degrees. For example, the switches SW1, SW2 are open to generate the first amount of phase shift ($\phi_1$) and closed to generate the second amount of phase shift ($\phi_2$). As discussed above, the difference in group delay between the first and second amounts of phase shift is substantially zero.

The second bit 1104 of the phase shifter 1100 is configured as the phase shifter 300 shown in FIG. 3 and comprises transmission lines and components that are configured to generate a difference in phase shift ($\phi_1-\phi_2$) that is equal to 90 degrees. For example, the switches SW3, SW4 are open to generate the first amount of phase shift ($\phi_1$) and closed to generate the second amount of phase shift ($\phi_2$). As discussed above, the difference in group delay between the first and second amounts of phase shift is substantially zero. In various exemplary embodiments, a baseband processor or other entity operates to generate the control signals necessary to selectably open or close the switches SW1-SW4 to obtain the desired amount of phase shift. Furthermore, the multi-bit phase shifter 1100 can be configured to have any number of bits, and each bit can be configured to have any of the implementations shown in FIG. 3, FIG. 7, or FIG. 9.

Figure 12:
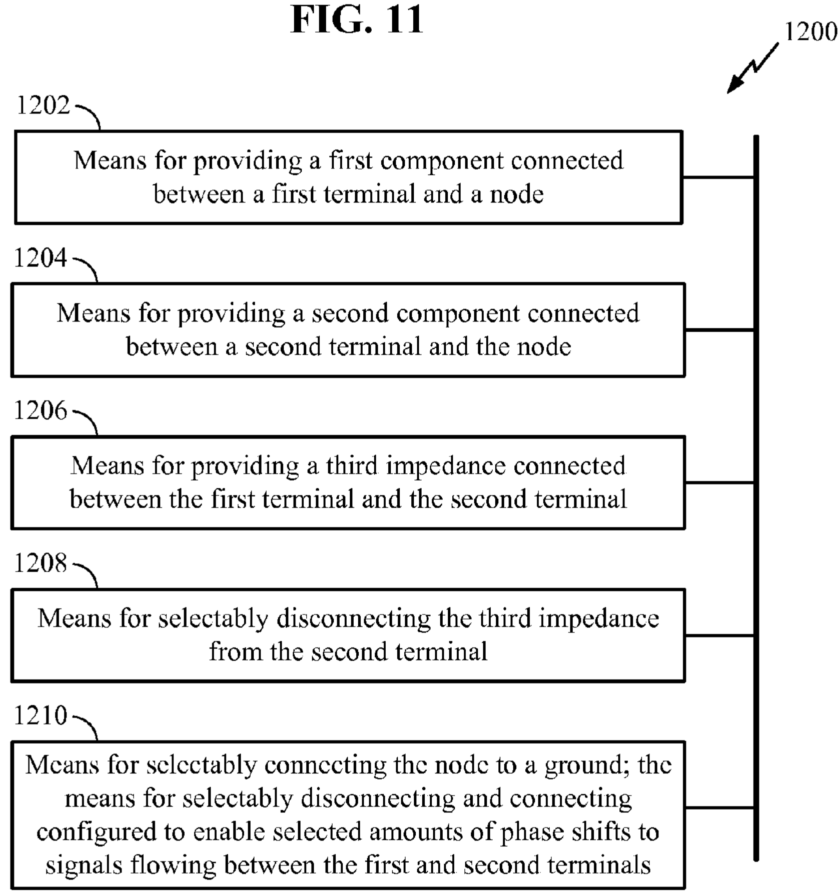
FIG. 12 shows an exemplary embodiment including a plurality of means of a phase shifter apparatus.

FIG. 12 shows an exemplary embodiment including a plurality of means of a phase shifter apparatus 1200. For example, the apparatus 1200 is suitable for use as any of the phase shifters 106 shown in FIG. 1. In an aspect, the apparatus 1200 is implemented by one or more modules configured to provide the functions as described herein. For example, in an aspect, each module comprises hardware and/or hardware executing software.

The apparatus 1200 comprises a first module comprising means (1202) for providing a first component connected between a first terminal and a node, which in an aspect comprises the impedance 206.

The apparatus 1200 also comprises a second module comprising means (1204) for providing a second component connected between a second terminal and the node, which in an aspect comprises the impedance 208.

The apparatus 1200 also comprises a third module comprising means (1206) for providing a third impedance connected between the first terminal and the second terminal, which in an aspect comprises the impedance 210.

The apparatus 1200 also comprises a fourth module comprising means (1208) for selectably disconnecting the third impedance from the second terminal, which in an aspect comprises the switch 212.

The apparatus 1200 also comprises a fifth module comprising means (1210) for selectably connecting the node to a ground, which in an aspect comprises the switch 214; the means for selectably disconnecting and connecting configured to enable selected amounts of phase shifts to signals flowing between the first and second terminals.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:

a first component connected between a first terminal and a node;

a second component connected between a second terminal and the node;

a third impedance connected between the first terminal and the second terminal;

means for selectably disconnecting the third impedance from the second terminal, the means for selectively disconnecting the third impedance being coupled in series with the third impedance; and means for selectably connecting the node to a ground, the means for selectably disconnecting and connecting configured to enable selected amounts of phase shifts to signals flowing between the first and second terminals, wherein a first group delay of the selected amounts of phased shifts, measured when the third impedance is disconnected from the second terminal and the node is disconnected from the ground is substantially equal to a second group delay of the selected amounts of phased shifts, measured when the third impedance is connected to the second terminal and the node is connected to the ground.

2. The apparatus of claim 1, a first amount of phase shift of the selected amounts of phased shifts, is provided between the first and second terminals when the third impedance is disconnected from the second terminal and the node is disconnected from the ground, and a second amount of phase shift of the selected amounts of phased shifts, is provided between the first and second terminals when the third impedance is connected to the second terminal and the node is connected to the ground.

3. An apparatus comprising:

a first component connected between a first terminal and a node;

a second component connected between a second terminal and the node;

a third impedance selectively connected between the first and second terminals by a first switch coupled in series with the third impedance, wherein the third impedance comprises a capacitor;

a second switch connected between the node and a ground, the first and second switches configured to enable selected amounts of phase shifts to signals flowing between the first and second terminals; and wherein the first and second components comprising first and second transmission lines, respectively.

4. The apparatus of claim 3, the first and second transmission lines are configured to provide a first amount of phase shift of the selected amounts of phased shifts, between the first and second terminals when the first and second switches are in an open position.

5. The apparatus of claim 4, the first transmission line, the second transmission line, and the third impedance are configured to provide a second amount of phase shift of the selected amounts of phased shifts, between the first and second terminals when the first and second switches are in a closed position.

6. The apparatus of claim 5, the first amount of phase shift is configured to be different from the second amount of phase shift by a selected value.

7. The apparatus of claim 6, the selected value chosen from a set of values consisting of 180, 90, and 45 degrees.

8. An apparatus comprising:

a first component connected between a first terminal and a node;

a second component connected between a second terminal and the node;

a third impedance selectively connected between the first and second terminals by a first switch coupled in series with the third impedance; and a second switch connected between the node and a ground, the first and second switches configured to enable selected amounts of phase shifts to signals flowing between the first and second terminals, wherein a first group delay of the selected amounts of phased shifts, measured when the first and second switches are open is substantially equal to a second group delay of the selected amounts of phased shifts, measured when the first and second switches are closed.

9. The apparatus of claim 8, further comprising a fourth impedance connected between the node and the ground.

10. The apparatus of claim 9, the fourth impedance comprising a second capacitor.

11. The apparatus of claim 8, the first and second components comprising first and second capacitors, respectively, the third impedance comprising a first inductor and further including a fourth impedance connected between the node and the ground, the fourth impedance comprising a second inductor.

12. The apparatus of claim 11, the first and second capacitors and the fourth impedance are configured to provide a first amount of phase shift of the selected amounts of phased shifts, between the first and second terminals when the first and second switches are in an open position.

13. The apparatus of claim 12, the first and second capacitors and third impedance are configured to provide a second amount of phase shift of the selected amounts of phased shifts, between the first and second terminals when the first and second switches are in a closed position.

14. The apparatus of claim 13, the first amount of phase shift is configured to be different from the second amount of phase shift by a selected value.

* * * * *